United States Patent [19]

Reuter

[11] 4,368,437
[45] Jan. 11, 1983

[54] WIDE FREQUENCY RANGE SIGNAL GENERATOR INCLUDING PLURAL PHASE LOCKED LOOPS

[75] Inventor: Anthony W. Reuter, Indianapolis, Ind.

[73] Assignee: Wavetek Indiana, Inc., Beech Grove, Ind.

[21] Appl. No.: 922,764

[22] Filed: Jul. 7, 1978

Related U.S. Application Data

[63] Continuation of Ser. No. 774,812, Mar. 7, 1977, abandoned, which is a continuation of Ser. No. 561,332, Mar. 24, 1975, abandoned.

[51] Int. Cl.³ .............................................. H03L 7/22
[52] U.S. Cl. ............................................ 331/2; 331/19; 331/22; 331/31
[58] Field of Search ............... 331/2, 19, 22, 30, 31, 331/179; 328/14

[56] References Cited

U.S. PATENT DOCUMENTS

| | | | |
|---|---|---|---|
| 2,786,140 | 3/1957 | Lewis | 331/2 |
| 2,875,337 | 2/1959 | Robinson | 331/2 |
| 2,888,562 | 5/1959 | Robinson | 331/2 |
| 2,957,144 | 10/1960 | Huhn | 331/2 |
| 2,964,714 | 12/1960 | Jakubowics | 331/2 |
| 3,229,219 | 1/1966 | Berman | 331/2 |
| 3,268,831 | 8/1966 | Noordanus et al. | 331/2 |
| 3,372,346 | 3/1968 | Rogers et al. | 331/2 |
| 3,435,367 | 3/1969 | Little, Jr. | 331/2 |
| 3,518,586 | 6/1970 | Nilssen et al. | 331/179 |
| 3,588,732 | 6/1971 | Tollefson | 331/2 |
| 3,848,199 | 11/1974 | Weber | 331/19 |
| 3,857,099 | 12/1974 | Lohrmann | 331/19 |

FOREIGN PATENT DOCUMENTS

| | | | |
|---|---|---|---|
| 603726 | 6/1948 | United Kingdom | 331/19 |
| 979861 | 1/1965 | United Kingdom | 331/2 |

OTHER PUBLICATIONS

Electronic Design, A. Coludner, pp. 124–127, Sep. 27, 1963.

*Primary Examiner*—Siegfried H. Grimm
*Attorney, Agent, or Firm*—Ellsworth R. Roston; Charles H. Schwartz

[57] ABSTRACT

A wide band oscillator with phase lock loop is controlled by signals from an 40 MHz harmonics generator combined with the output of another phase lock loop controlled oscillator whose selectible outputs vary in MHz steps with a total range of 39 MHz. The phase lock loop of the wide band oscillator is additionally controlled by a d/a converter and by another phase lock loop controlled oscillator whose selectible outputs vary in one KHz steps. Each of these phase lock loops is digitally controlled from the input frequency selection and again therefrom via a digital-to-analog converter. The output of the wide band oscillator is combined with the output of a narrow band oscillator which may be FM modulated. Alternatively, an output amplifier for the combination difference frequency may be AM modulated.

29 Claims, 3 Drawing Figures

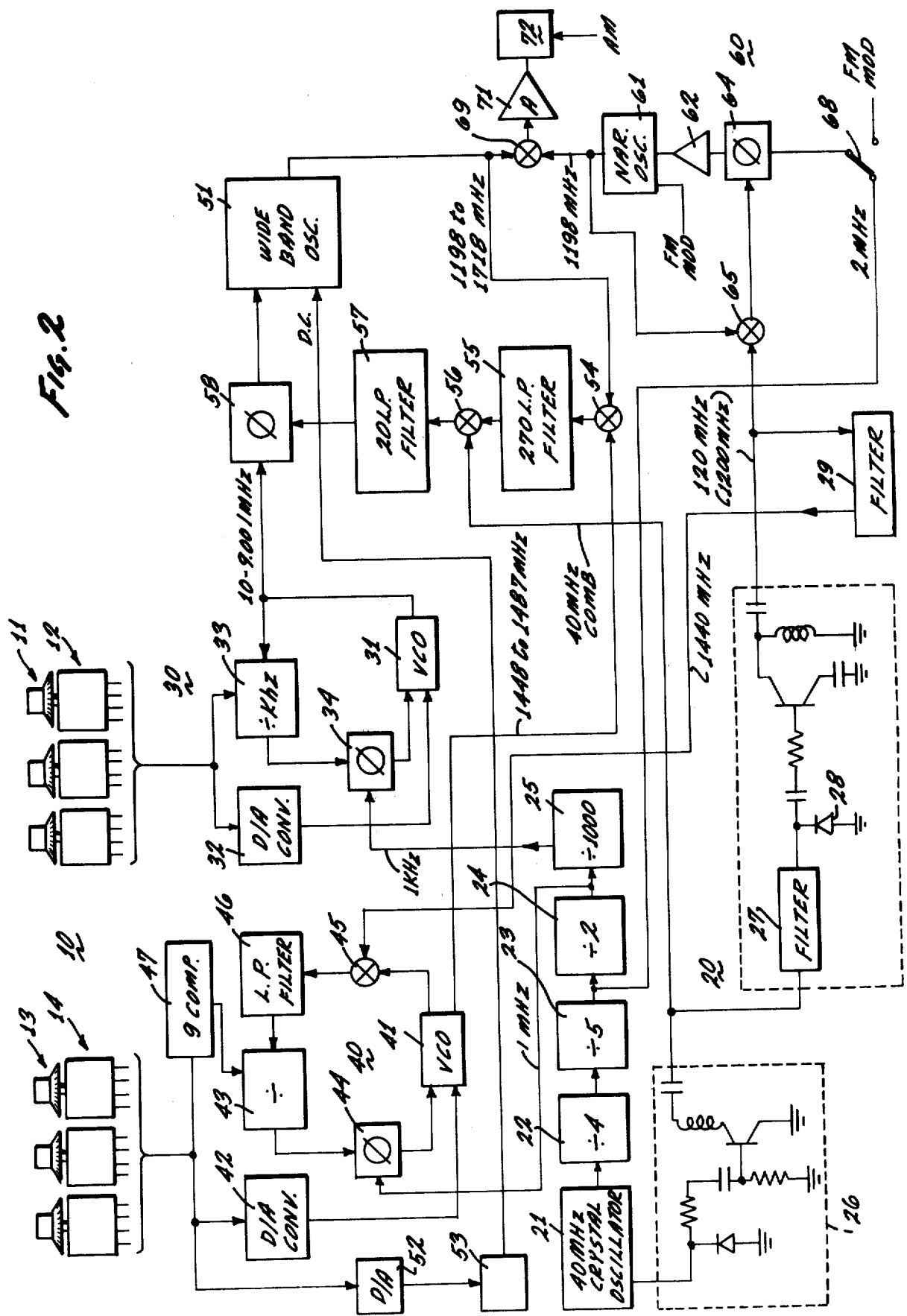

WIDE FREQUENCY RANGE SIGNAL GENERATOR INCLUDING PLURAL PHASE LOCKED LOOPS

This is a continuation of application Ser. No. 774,812 filed Mar. 7, 1977, which is in turn a continuation of application Ser. No. 561,332 filed Mar. 24, 1975.

BACKGROUND OF THE INVENTION

The present invention relates to signal generators and more particularly the invention relates to VHF frequency signal generators of the type which permit selection of the generation of frequencies over a wide range.

Signal generators of the type to which the invention pertains are used for example as reference signal generators. In order to ensure a rather wide range of application for a single product, the signal generator should permit selection of frequencies to be generated within a wide range, but each selected frequency to be selected should be adjustable to remain within very small tolerances which should be the same for any frequency within the range of interest. Providing for adjustment of any frequency with a range from e.g. 1 MHz to about 500 MHz or higher in steps of, for example, 1 KHz poses a significant problem particularly when each of these signals should remain stable to, say one-thousandth of 1 percent.

DESCRIPTION OF THE INVENTION

It is an object of the present invention to provide for a new and improved high frequency signal generator meeting the aforementioned requirements.

In accordance with the preferred embodiment of the present invention, it is suggested to obtain the desired output frequency by way of multiple frequency mixing and compositioning in that the entire range of frequencies to be covered and the particular frequencies therein are organized on the basis of interdigitized, superimposed scales of differing resolution. Adjustment of the frequency within a larger resolution scale is carried out within any two scale points thereof only, independently from their value and by means of the scale values of next lower resolution. In other words, the frequency to be selected is broken down for representation by "digits" of different significance. The frequency values corresponding to these digits are generated separately and superimposed in a frequency mixing process to generate the desired frequency. The generation may be an indirect one in that the superimpositioning is carried out at the input of a phase lock circuit used to control an oscillator in feedback configuration. By way of example, "digits" within the meaning of the term employed here are multiples of 40 MHz corresponding to low resolution scaling. Megahertz values from 0 to 39 are used as next higher resolution and any kilohertz value (below 1 MHz) provides highest resolution-lowest significant scaling. This constitutes a three-"digit" scale system to cover for example several hundred megahertz at a resolution of 1 KHz.

More specifically, the relatively large range of frequencies to be covered by the selection is first subdivided by means of a low or coarse resolution scale in that a plurality of frequencies are generated whose frequencies are equidistantly spaced (e.g. by 40 MHz); one will use here preferably a harmonics generator to provide for the signal representation of that low resolution scale, and these frequencies will be used, so to speak, as an overlay covering the entire band of interest and establishing the low resolution scale.

The output element of the signal generator is an oscillator configuration which includes a wide band oscillator for the production of the desired frequency. As far as the low resolution scaling is concerned, that wide band oscillator is controlled by an input frequency selection operating at least to an accuracy so that upon mixing its output with the output of the harmonics generator (or its equivalent) one frequency thereof is selected by operation of a phase lock loop that controls the wide band oscillator.

The frequency selection based on higher resolution scales are staggeredly attached to the selected low resolution scale frequency. They are synthesized separately and for a range only in each instance that spans the range between respective two scale points of next lower resolution and, on the other hand, "neglects" the respective "digits" of higher significance. By way of example, a separate phase lock loop establishes a controlled frequency for any selected frequency but having value only within the range defined by two scale points of the lowest resolution scale, under neglect of the next higher resolution scale. If, for example, the low resolution scale points are apart by 40 MHz, then the phase lock loop for frequencies of next higher significance provides thirty-nine different frequencies 1 MHz apart. The resulting signal is mixed with the wide band oscillator output and the resultant is used for mixing with the output harmonics generator to obtain the low resolution scale selection. The open loop control of the wide band oscillator approximates (but does not equal) this next higher resolution scale selection, but the closed loop will track the particular higher resolution frequency (1 MHz) reference in conjunction with the selected and superimposed low frequency scale point.

The highest resolution frequency adjustment, such as a selection below 1 MHz and in kilohertz steps defines the third resolution scale and "digit" in an assumed 3 digit scale. That frequency is separately synthesized and is introduced as reference for the phase lock loop whose other input has been scaled down through the aforementioned mixing process involving the frequencies defining the respective lower resolution selection.

Generally speaking the frequency selection on the higher resolution scale proceeds with such a scale in each instance in that a voltage controlled oscillator is controlled in a phase lock loop which includes a frequency division of the respective oscillator output, by a number representing the selection within the particular scale range (e.g. below 40 MHz value and KHz value). The output of the respective oscillator represents the respective frequency at the desired accuracy to which is attached (by addition or subtraction) a fixed frequency for purposes of facilitating the combining thereof with other frequencies for use in the phase lock loop of the wide band oscillator.

It can thus be seen, that the invention includes plural oscillation circuits each operating over a different range, each being adjusted within a different range to produce one of a plurality of different, selectible discrete frequencies. The selection is digitially controlled from different portions of the input selection circuit. Each of the oscillation circuits includes the particular digital selection as part of a phase lock loop. One of the oscillation circuits receives the outputs of the others as inputs and it receives also the output of a harmonics generator selecting one frequency thereof through the feedback loop and by operation of its connection to the input section. The other frequencies are appended to that selected harmonic to obtain a preliminary output signal of the generator as output of the one oscillation circuit. The final output results from beating the preliminary output with a reference to shift the signal to the desired frequency range. The latter reference may be used for introducing frequency modulation.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a more detailed and partial circuit diagram of the system shown in FIG. 1.

Proceeding now to the detailed description of the drawings, FIG. 1 illustrates an input section 10 for selecting the desired output frequency from 1 to 520 MHz, in 1 KHz steps (resolution). The various frequencies needed in the system are generated in a module 20 which is under control of a master-crystal oscillator 21 (FIG. 2). A section 30 provides for establishing and controlling the particular kilohertz value (below megahertz adjustment) in steps of one kilohertz covering $10^3$ different steps accordingly. Section 40 establishes analogously the megahertz adjustment steps, but on a modulo 40 basis covering therefor the 520 different megahertz values on a repetitive scale only, within an assumed, low resolution frequency scale having 40 MHz as unit.

Figure 1:
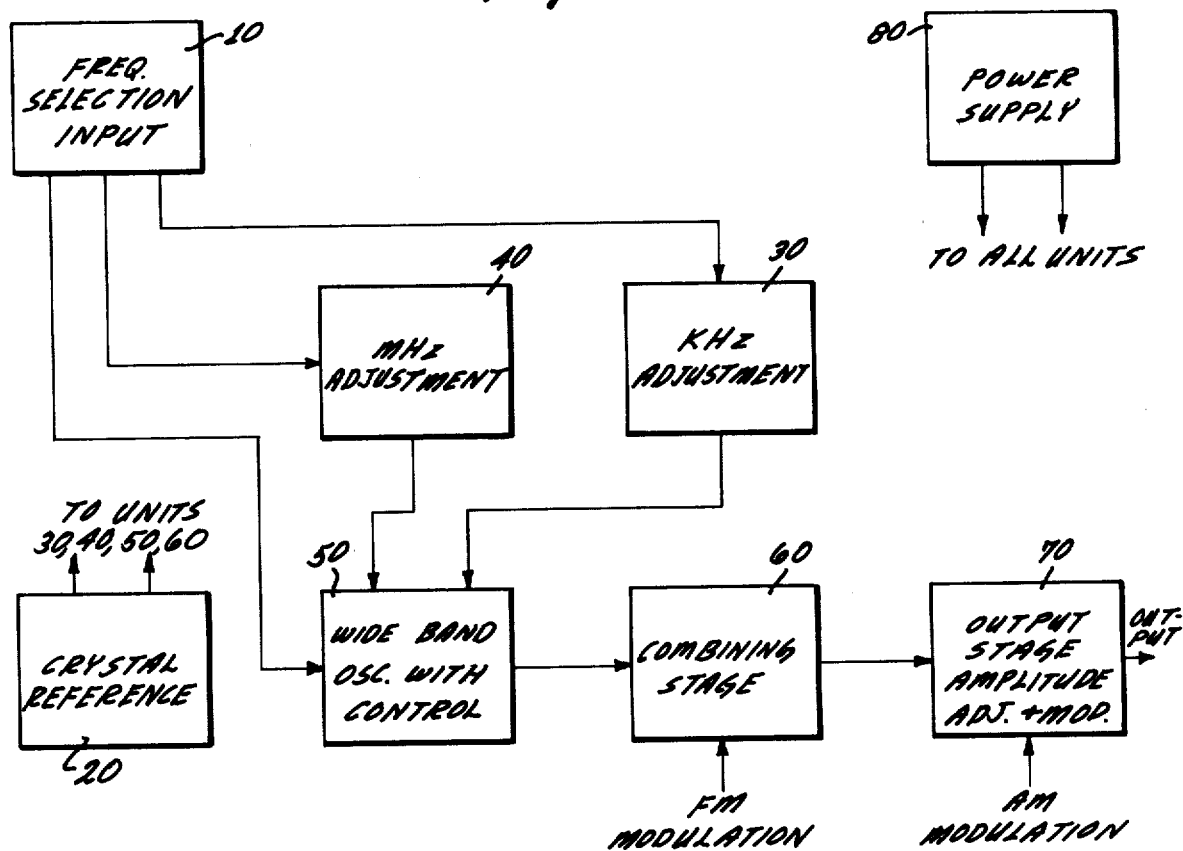
FIG. 1 is a block diagram outlining the system in accordance with the preferred embodiment by means of major components.

A section 50 is the primary oscillation stage from which the adjusted frequency can be derived. This wide band oscillation stage is under control of the stages 10, 20, 30 and 40. Oscillation stage 50 covers a range from approximately 1200 MHz to a little over 1700 MHz. A signal combining stage 60 combines the output from stage 50 with a fixed reference to shift the frequency from stage 50 to the desired range from 1 to 520 MHz. Stage 60 accepts also frequency modulation signals if such modulation is desired.

Reference numeral 70 refers generally to output amplification, attenuation and amplitude modulation which is not of immediate interest and requires only summary description. The amplitude modulation accepts for example DC to 20 KHz signals from any external source (suitably matched of course). Section 70 includes manual amplitude and output level control. Additionally, the unit may include several oscillators to provide for internal AM or FM modulation to serve as standard.

Finally, the unit includes a power supply 80 to obtain regulated d.c. at various levels to serve as driving power for the several active circuit elements. Again, this is a conventional subsystem and does not require elaboration.

Turning now to FIG. 2, input section 10 has six adjustment knobs (levers, thumb wheels or the like) three of which are denoted 11 and connected to circuits 12 to provide the selected KHz value in "ones", "tens" and "hundreds", each in bcd format. These signals are the primary input for the circuit 30. Analogously, three circuits 14 are respectively connected to the three other input elements, 13, to provide the selected MHz value in "ones", "tens" and "hundreds" (the latter up to 500, which is an arbitrary limit). These signals are likewise furnished in bcd format, and circuit 14 provides them to circuits 40 and 50.

The module 20 includes a 40 MHz crystal oscillator 21 with output amplification to provide the oscillation at a suitable level and as standard from which all other frequencies are derived. A variety of different, phase related signals are needed throughout the system. Therefor, the output signal from oscillator 21 is fed to a plurality of digital processing circuits which divide the frequency in steps. Accordingly, a divide-by-four stage 22 (e.g. two cascaded toggle flip-flops) provide, as an output, a 10 MHz signal. That signal is further divided by 5 in a stage 23 to provide a 2 MHz signal which in turn is divided by 2 in a stage 24 to obtain a 1 MHz signal. Finally, a divide-by-thousand stage 25 provides a 1 KHz signal.

The 40 MHz oscillator signal is a.c. processed in a second branch wherein a circuit 26 generates the harmonics of that 40 MHz signal. In other words, circuit 26 provides a composite signal which includes the 40 MHz, (as fundamental), a 80 MHz component, a 120 MHz component etc. Circuit 26 is basically comprised of a diode and an amplifier. This train of harmonics will hereinafter be called the 40 MHz comb. This 40 MHz comb establishes the low resolution frequency scale points to be used in the compositioning of the desired output frequency.

A branch circuit taps the comb and particularly a band pass filter 27 separates the 120 MHz harmonic from the comb. A circuit 28, constructed analogously to circuit 26, generates a composite signal which includes 120 MHz as fundamental and the harmonics thereof. A band pass filter 29 separates the 1440 MHz signal component therefrom for use as a particular frequency.

The purpose of the remaining circuit of FIG. 2 and to be described next is to generate a signal of particular frequency within a range from 1 MHz to 520 MHz at a 1 KHz resolution and corresponding to the setting of input elements 11, 13 using the signals from stage 20 as "building blocks" while the setting of input elements 10 determines which particular frequency is to be generated.

The synthesis of the desired signal proceeds in four steps. In the first step, the input setting of the three elements 11 defining the kilohertz (below megahertz) value for the selected frequency is processed to generate an auxiliary frequency which represents that setting, in a convenient range, and being variable in steps of 1 KHz in accordance with the setting of elements 11. For reasons which will become apparent below, that particular auxiliary signal covers a range from 10 MHz down to 9.001 MHz in steps of 1 KHz, whereby the 10 MHz value is produced for a 000 kilohertz setting of input elements 11, and the 9.001 MHz is produced for a 999 setting of elements 11. This particular auxiliary signal is provided by stage 30 as an output. One could also say, that stage 30 provides a 0 to 999 KHz signal but following a subtraction from 10 MHz for purposes preparing the signal for further processing.

The second step, occurring so to speak in parallel with the first one, is provided to generate another auxiliary frequency which represents the megahertz setting on a modulo 40 basis. Specifically, circuit 40 provides an output which is 1448 MHz for a megahertz setting of 000 by elements 13, but the same 1448 MHz is also provided for a megahertz setting of 40, or 80 up to a megahertz setting of 520. The output of circuit 40 is a 1487 MHz signal for a megahertz setting of 39, but also for settings of 79, 119, etc. up to 519. One could also say that stage 40 provides a 0 to 39 megahertz signal to which has been added a 1448 signal for reasons of preparing the signal for further processing.

In the third step, these two auxiliary signals from stages 30 and 40 are combined with each other, and with the 40 MHz comb signal to obtain a signal within the range from 1198 to 1718, but having the desired resolution and accuracy. The circuit combining these signals operates additionally in response to the megahertz setting of the switches 13 and using closed loop operation to select the particular comb signal needed as low resolution scale point frequency to which the other frequencies are "appended". Circuit 50 provides for these functions.

The fourth and final step is comprised of beating this 1198–1718 MHz signal with an 1198 signal to obtain the desired signal within the range from 0 to 520 MHz.

The first mentioned, auxiliary signal is generated as the output of stage 30. The principal, output-generating element is a voltage controlled oscillator 31 whose d.c. input is derived from a digital-to-analog converter 32. That converter receives signals representing the below-megahertz setting and provided as bcd signals by the three stages 12. The bcd digits represent the kilohertz settings of elements 11. The VCO 31 is designed to provide a 10 MHz output for a 000 setting, and a 9.001 MHz output for a 999 setting; the converter 32 controls VCO 31 accordingly.

Aside from being the principle output of stage 30, this output signal of VCO 31 is fed to a frequency divider stage 33, which receives also the bcd equivalent signals for the three lower significance digit settings of elements 11, to control the divisor in stage 33. The output of VCO 31 is provided to frequency divider 33 as "dividend" and the frequency of this particular signal is divided therein by a number (divisor) representing the kilohertz setting, but being scaled to the VCO output. As stated, that output is a signal having one particular frequency that may range from 10.0 to 9.001 MHz. Accordingly, the divisor actually used ranges from 10,000 to 9,001 for the range of kilohertz settings (000 to 999) so that dividing stage 33 provides always a 1 KHz output (± any error). Stage 33 can be realized by a combination of 8 chips traded under the designation 7404, 8290, 82S90, 74H11 and 74H102.

The 1 KHz output (± any error) of stage 33 is fed to a phase lock circuit 34 being, for example, of the type traded by the Motorola Company under the description 4044. Circuit 34 receives additionally a reference signal which is the 1 KHz signal from frequency divider 25 in circuit 20. The output of phase lock circuit 34 is added as corrective control to the input of VCO 31 to establish a phase lock loop.

The second auxiliary signal being the output of stage 40 is generated somewhat analogously. Stage 40 has a voltage controlled oscillator 41 as principal output element, which receives an input from a digital-to-analog converter 42. The digital input for converter 42 is derived from the megahertz setting of input circuit 10 but on a modulo 40 basis. The analog signal, therefore, has the same value for settings of elements 13 to "0", "40", "80" MHz etc. The analog signal for a 1 MHz is also the same for settings of 41, 81, etc. The (same) maximum output is provided by the converter 42 for megahertz settings 39, 79, 119, etc. up to 519.

The output signal of d/a converter 42 determines the output frequency of VCO 41, they have the same value for such modulo-40 interrelated megahertz settings. As stated above, the lowest frequency is 1448 for a 000 megahertz setting and the highest frequency is 1487 megahertz for 38, 79 settings etc. The reason for using the 1448 value as low point frequency will become apparent below, it is instrumental in preparing the control for the principle oscillation of the system.

The frequency control involves a mixing stage 45 receiving the 1440 MHz signal from circuit 20 (stage 29 thereof) as a first input, and the output of VCO 41 is a second input for mixer 45. A low pass filter 46 with a roll off frequency of 60 MHz eliminates the sum-of-the-frequencies signal so that the effective output is a signal that varies from 8 to 47 megahertz. A digital circuit 47 is connected to the stages 14 of the input section 10 and forms the nines-compliment of the digital, modulo-40 signal representing the megahertz setting, and circuit 47 provides signals representing that number as divisor for a frequency dividing circuit 43. The "dividend" signal is the output signal of filter 46 so that for stationary conditions, a 1 MHz signal issues from that dividing circuit 43.

The output of frequency dividing circuit 43 is fed to another phase lock circuit 44, which receives the 1 MHz signal from stage 24 of circuit 20 as reference. The phase lock circuit 44 provides a control signal to the VCO 41 to phase lock the output to the 1 MHz reference.

It can thus be seen, that the settings in input section 10 representing the desired frequency have been processed thus far to provide for a first auxiliary signal representing the below-megahertz setting but covering that range by providing a 10 through 9.001 MHz signal in steps of 1 KHz. The second auxiliary signal does not fully represent the megahertz input setting, but on a modulo 40 basis covering that range by providing a 1448 through 1487 MHz signal in steps of 1 MHz. The low points (all zero) of the settings are respectively represented by a 10 MHz and by a 1448 MHz signal.

The upper scale range (i.e. the digits of higher significance with regard to the 40 MHz scale points for the megahertz setting) is acquired by means of another digital-to-analog converter 52 of circuit 50, and by introducing the comb which can be regarded as establishing scale points 40, 80, 120, 160 MHz etc. Since the outputs of circuits 30 and 40 are also used in this process of establishing the 40 MHz scale range, it is convenient to consider these outputs for respective low point or zero settings, wherein circuits 30 and 40 respectively provide 10 and 1448 MHz signals. Thus, the input is assumed to be 0 MHz and 000 KHz.

Digital-to-analog converter 52 responds to the megahertz setting in total; it could share components with converter 42, but separate block representation is simpler for purposes of explanation. The output of that converter 52 covers a wide range and is for example processed in a stage 53 for a non-linear signal configuration. That signal shaper 53 now drives a wide band oscillator 51 operating within a margin of error of several MHz. Oscillator 51 covers the range from 1198 to 1718 MHz at that accuracy.

Figure 3:
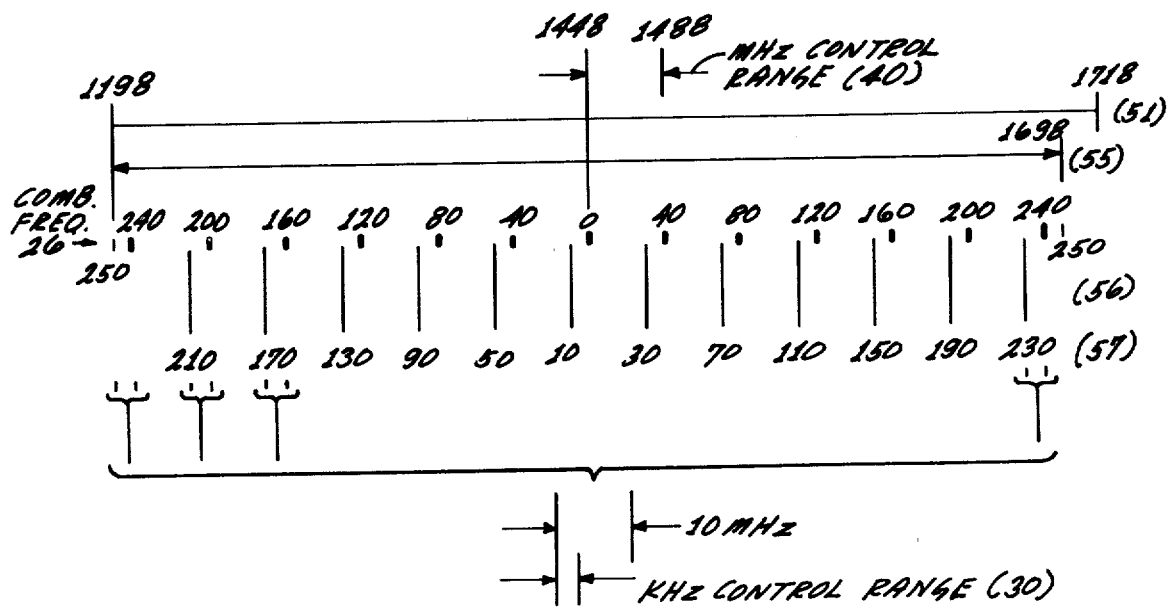
FIG. 3 shows several frequency spectrums of signals developed in the circuit of FIG. 2.

The various frequency relations are shown in FIG. 3 wherein the various frequencies are shown in megahertz and the figures in parenthesis refer to the element shown in FIG. 2 which produces the respective signal. The output of oscillator 51 is (exactly or approximately) 1198 MHz for a 0 MHz setting. A mixing stage 54 combines that signal with the output of VCO 41 assumed to be 1448 MHz, which is approximately the mid-point between the range limits of 1198 and 1718 MHz. A low pass filter 55 cuts off the sum-of-the-frequencies signal so that only 250 MHz passes which results from frequency subtraction. That signal now beats with the 40 MHz comb signal (40, 80, 120 ... MHz) in a mixer stage 56. The differences are 250-40; 250-80; 250-120; 250-160; 250-200; 250-240; 280-250; 320-250; ... etc. A low pass filter 57 eliminates again the sum-of-the-frequencies signal so that differences are formed only. Moreover, not all these differences are wanted. Therefore, the filter 57 has a cut off frequency of 20 MHz, so that only the difference between 250 MHz and the "nearest comb" is formed which presently is the 240 MHz component of the comb, so that the output of filter stage 57 provides a 10 MHz signal. (exactely or approximately)

Presently the establishing of the 40 MHz unit, low resolution scale is being considered and briefly, we turn to an input setting of 40 MHz, 80 MHz, 120 MHz etc. In all these cases, circuit 41 furnishes 1448 MHz. While oscillator 51 provides 1238 or 1278 or 1318, etc. MHz as the case may be. Circuits 54, 55 provide accordingly 210, 170, 130 ... or 10 MHz for outputs of the oscillator 51 having frequency below this center frequency of 1448 MHz; while circuit 54/55 provides one of the frequencies, 30, 70, 110, 150 ..., when the output of oscillator 51 has frequency above the 1448 MHz reference value. Upon beating these signals with the comb a difference signal of 10 MHz will be established in each of these cases.

Thus, it can be seen from FIG. 3 that the oscillator 51 establishes a band from 1198 to 1718 MHz, of which 1448 MHz is the approximate center point with double side bands up to 250 MHz. The beat circuit 54 separates that band and one of the following frequencies of 250, 210, 170, 130, 90, 50, 10; 30, 70, 110, 150, 190 and 230 is established within that MHz band. Filter 55 eliminates the sum-of-the-frequencies in each instance. Each of these frequencies is 10 MHz off the respective nearest comb (to one side or the other) which are the frequencies 0, 40, 80, 120 MHz etc. Any of the frequencies permitted to pass 55 is a side band signal to a comb-frequency whereby the upper side band is used and established (250 or 210, ... or 10 MHz) for an oscillator 51 signal having frequency below the 1448 MHz reference and the lower band is used and established (30 or 70 or 110 ... 230 MHz) for an oscillator 51 signal having frequency above the 1448 MHz reference. But in each of these cases, beating the output of the combination of mixer and low pass circuits 54 and 55 with the comb produces a 10 MHz output (and others but the 20 MHz low pass 57 passes only this signal)!

The output of filter 57 (presently presumed to be 10 MHz) is now compared in a phase lock 58 using the output of circuit 30 as a reference. This reference is presently presumed to be 10 MHz, as we started these considerations on the basis of an all-zero setting for the kilohertz switches in input section 10. The output of circuit 58, therefor, represents any error deviation of the oscillator 51 from a frequency corresponding to a setting to the scale points 0, 40, 80, 120 etc. That output is provided as second input to oscillator 51 to close the loop accordingly.

If we consider a frequency selection to one of the megahertz scale points only (0, 40, 80, etc), then the megahertz circuit 40 produces the 1448 reference frequency at the stated accuracy in all instances by virtue of its own phase lock loop, and circuit 30 produces the 10 MHz reference at the same accuracy. The D/A converter 52 produces a d.c. value for which oscillator 51 approximates the desired frequency so that the feedback loop establishes a 1198, or 1238 or 1278 etc. value, respectively for a megahertz setting of 0, 40, 80, etc. on the basis of the accuracy of the comb frequencies which determine the particular frequency towards which the phase lock loop of oscillator 51 is being controlled.

The output of d/a converter 52 fulfills actually two functions which are conveniently combined. The primary function however, is the scale point selection (for which a much lesser resolution were needed if that were the only function). Particularly, the output of converter 52 is used to select the particular frequency from the 40 MHz comb, as already mentioned. This selection is done through feedback of oscillator 51 and in mixer 56. The mixer 54 and, ultimately, the 1440 MHz signal as transmitted through circuit 40 (and augmented to 1448 MHz) prepares the frequency range for the scale point selection (comb frequency). A better resolution in the digital-to-analog conversion of circuit 52 is simply more convenient to permit combining of the feedback signal of oscillator 51 in steps with the outputs of circuits 30 and 40 in one loop which contains phase lock 58 as active control element and does not have to include circuitry covering too large a range for control. This then is the result of another combination of function, namely the scaling range reduction through formation of a band by operation of that 1448 MHz signal as mixed with the output of oscillator 51, and by the use of that 1448 signal as reference in the sense that the below the 40 scale, megahertz selection is appended thereto for introduction into the system and combination with the comb selected 40 MHz scale point.

The preceding paragraphs were devoted to the description of establishing the particular frequencies corresponding to the low resolution scale points, while we neglected the 1 to 39 megahertz and the below-megahertz adjustment. That the circuit faithfully produces outputs representing these higher resolution frequency adjustments will be established next.

It will be appreciated that the auxiliary signal of circuit 40 as defined above, namely the 1448 to 1487 MHz signal, depends on the megahertz adjustment within any two adjacent 40 MHz scale points; such megahertz adjustment merely shifts the range for the signal with which it is beat by operation of mixer 54. This operation will be described next.

Let us assume an adjustment, or a variation in adjustment in megahertz steps (absolute) from 1 to 39 MHz as far as input elements 13 are concerned. The output of VCO 41 reproduces that adjustment faithfully in 1-Megahertz steps but covering the range by signals having frequency from 1449 to 1487 MHz. The output of oscillator 51 reproduces the setting of the input for D/A converter 52 also in like steps, from about 1199 to 1237 (with an assumed error of less than 2 MHz). Thus, the output of mixer 54 stays at approximately 250 MHz, so that upon beating that signal with the 40 MHz comb (56), and upon filtering by means of the 20 MHz low pass filter 57, one will always use the 240 MHz comb component, resulting in a 10 MHz output of mixer 56 and low pass 57 in each instance!

For a megahertz setting of 41 and above, but below 80, the outputs of circuits 40 and of oscillator 51 are now apart by more than 40 MHz so that the difference frequency is 210 MHz, and upon beating that signal with the 40 MHz comb the 200 MHz component thereof will be used by 56, 57 to establish the 10 MHz difference frequency as side band from this particular comb frequency. A setting of 81 MHz will cause the use of the 160 MHz comb frequency etc.

It can thus be seen, that the circuit 40 stabilizes the output of oscillator 51 (through phase lock 58) so that the output of filter 57 remains 10 MHz (or approximately 10 MHz). The 10 MHz output from circuit 30 serves as reference in phase lock 58 and its operation controls the device to adjust the output frequency accurately to any of the megahertz settings.

For the kilohertz setting, the reference signal from circuit 30 is changed within the range from 10 to 9.001 MHz in steps of 1 KHz, as per the three least significant setting by the three elements 11 of input section 10. It can readily be seen that the phase lock loop will tend to establish the value of the particular reference setting as output for oscillator 51, and strictly by feedback operation.

It will be recalled that the output of mixer/band pass 54/55 for a 000 setting of the kilohertz input was e.g. 250, or 210, or 170 MHz etc. These particular frequencies resulted from a frequency subtraction in which the feedback frequency (from 51) was subtracted from the signal as provided by circuit 40. Thus, for a non-zero kilohertz setting, the feedback signal will increase, but the output of mixer/filter 54/55 will drop to a value below 250 or below 210 or below 170 as the case may be. The nearest comb frequency in each instance is lower than the filter output. Consequently, upon beating the output signal of filter 55 with the 40 MHz comb, a below-10 MHz difference frequency results commensurate with the kilohertz setting and further commensurate with the below-10 MHz reference signal as presently provided by the circuit 30. On the other side of the megacycle midpoint range, i.e. for feedback frequencies of oscillator 51 larger than the auxiliary output (1448 to 1487 MHz) from 40 (i.e. 41), the output of mixer/filter 54/55 will be 30 or 70 or 110 MHz etc. plus in each instance the value for the kilohertz setting. Those frequencies are below the respective nearest comb frequency, so that again the difference frequency as established by mixer 56 is below 10 MHz; the difference taken down from 10 MHz is equal to the kilohertz setting which is again compatible with the reference from circuit 30. This then is the reason for introducing the set kilohertz frequency on an inverted scale by means of circuit 30.

In summary, it can thus be seen, that the output of oscillator 51 results initially from a relatively low resolution digital-to-analog conversion of the input setting, and upon feedback thereof, while mixing it together with a separately synthesized below-40 MHz value, one establishes a signal which remains (by operation of the feedback loop) within a 10 to 9 MHz frequency spacing from the nearest comb frequency thereby establishing the 40 MHz scale points within the range of frequency covered by the wide band oscillator 51 while the MHz "fine" adjustment is added on. Using the comb and combined MHz adjustment, one establishes a 10-9 MHz feedback signal for phase lock control, still in the same loop, but in which the reference signal represents the kilohertz setting. The combination of signals, therefore, controls the wide band oscillator 51 to obtain the desired frequency within the stated accuracy.

The output signal of oscillator 51 is, of course, offset from the actually desired output by 1198 MHz, and shifting the range down to the desired range is the function of a mixer 69 beating the signal from oscillator 51 with the output of a narrow band oscillator 61 providing either that frequency of 1198 MHz at maximum spectral purity or as a carrier which is additionally frequency modulated.

The narrow band oscillator 61 is controlled as follows. Taking first the situation without modulation, oscillator 61 is controlled by an amplifier 62 establishing a particular d.c. input level for control of the oscillator and being itself controlled by a phase lock circuit 64 (the fourth one in the system) which responds to a feedback and a reference. The reference signal is the 2 MHz signal taken from the divide-by-5 circuit 23 in circuit 20. The feedback signal is generated by beating the output of oscillator 61 with the 120 MHz comb from circuit 28 in a mixer 65. Actually, one needs only the 1200 MHz harmonic so that a filter could be interposed; however, just beating the 1198 MHz output of oscillator 61 with the 120 MHz suffices to extract therefrom the one difference signal needed, namely 2 MHz which is fedback as second input to phase lock circuit 64. The narrow oscillator 61 is, therefore, controlled to produce precisely 1198 MHz which is combined in mixer 69 with the wide band oscillator output.

A wide band amplifier 71 amplifies the resulting signal which may have frequency from 0 to 520 MHz. However, the amplifier 71 should have low pass characteristics to reject the sum-of-the-frequencies signal. Also, one will use only frequencies above 1 MHz so that the passing characteristics of that amplifier for signals of lower frequencies does not have to be developed. An amplifier 72 is provided to accept an AM signal, suitably leveled, for amplitude modulation. Circuit 72 may further include resistors for providing for manual adjustment of the output signal through varying signal attenuation.

In the case of FM modulation, the position of a switch 68 is changed to separate the 2 MHz reference from the phase lock 64. Instead, a modulation signal covering a band from 1.5 to 2.5 MHz is introduced from a suitable source so that this modulation signal serves as reference. However, the feedback loop should be relieved from carrying out the entire modulation operation. Therefore, the FM modulation signal as such (i.e. 0.5 MHz band) is fed also directly to the oscillator 61 as input thereof, being merely superimposed upon the output of amplifier 62 as controlling oscillator 61.

The invention is not limited to the embodiments described above but all changes and modifications thereof not constituting departures from the spirit and scope of the invention are intended to be included.

I claim:

1. A signal generator for providing a signal selected within a larger band comprising:
   an input section with adjustable input elements;
   first circuit means providing a plurality of signals constituting a fundamental frequency and harmonics of the fundamental frequency, the frequencies of the signals of the plurality being equidistantly spaced by a factor related to the fundamental frequency;

second circuit means responsive to adjustments of at least first particular input elements of the input section to provide a signal of a first particular frequency related to the fundamental frequency but different from the fundamental frequency by a magnitude dependent upon the adjustments in the first particular input elements, whereby selected frequencies different from one another by successive harmonics of the fundamental frequency are represented by the second circuit means by signals of the same frequency;

third circuit means including a wide band oscillator responsive to the adjustments of at least the first particular input elements for providing a signal with a frequency within the larger band dependent upon such adjustments and further including mixing means and filter means disposed in a first phase lock loop with the wide band oscillator to combine the signals from the first and second circuit means and the wide band oscillator to select signals only in a first limited range of frequencies dependent upon first difference frequencies constituting differences between the frequencies of the signals from the wide band oscillator and the signals from the second circuit means and dependent upon second difference frequencies constituting differences between the first difference frequencies and the frequencies of the signals from the first circuit means;

fourth circuit means responsive to adjustments of at least second particular input elements of the input section to provide a signal of a second particular frequency less than the first particular frequency, the second particular frequency being related to the fundamental frequency but being different from such relationship by a magnitude dependent upon the adjustments of at least the second particular input elements; and fifth circuit means responsive to the signals from the third and fourth circuit means and disposed in the phase lock loop for adjusting the frequency of the wide band oscillator in accordance with any differences in the frequency of the signals from the third and fourth circuit means.

2. A signal generator as in claim 1, wherein the second circuit means includes a second phase lock loop and a first voltage controlled oscillator in the second phase lock loop for providing the signal of the first particular frequency in accordance with the adjustments of at least the first particular input elements, and wherein control means are included in the second phase lock loop for obtaining the production by the voltage controlled oscillator of the first particular frequency in accordance with the adjustments of at at least the first particular input elements in the input section.

3. A signal generator as in claim 2, wherein the third circuit means includes a first mixer for mixing the output of said wide band oscillator with said signal from the first voltage controlled oscillator to obtain the first difference frequencies and further includes a second mixer for mixing the output of the first mixer with the signals from the first circuit means to control the selection of the signals in the first limited range of frequencies in accordance with differences between the first difference frequencies and the frequencies of the signals from the first circuit means.

4. A signal generator as in claim 3, wherein the fourth circuit means includes a third phase lock loop and a second voltage controlled oscillator in the third phase lock loop and wherein the second voltage controlled oscillator is responsive to the adjustments in at least the second particular input elements in the input section for providing the signal of the second particular frequency with a higher resolution than the frequencies from the second circuit means and wherein second control means are included for introducing the output of the second voltage controlled oscillator to the fifth circuit means to provide a frequency reference for the production of the signals by the third circuit means.

5. A signal generator as in claim 1, wherein the mixer means controls the operation of the third circuit means to provide the second difference frequencies only in a range constituting the difference between the first difference frequencies and the signals from the first circuit means closest to the first difference frequencies.

6. A signal generator as in claim 1, wherein the third circuit means includes a first mixer and a first filter for beating the signals from the wide band oscillator and the second circuit means to generate signals having the first difference frequencies within a second limited range of frequencies and includes a second mixer and a second filter for beating the signals having the first difference frequencies from the first mixer means and the signals from the first circuit means to generate the signals having the second difference frequencies within the first limited range of frequencies where the first limited range of frequencies is less than the second limited range of frequencies.

7. A signal generator for providing a signal at a particular frequency, comprising:

a voltage-controlled, wide band oscillator providing an output signal having a frequency within a particular band;

first circuit means providing a signal having a frequency at a median position in said band;

first mixing means for combining the output signal of the oscillator with the signal from the first circuit means to provide signals having frequencies constituting a difference between the frequencies of the combined signals;

second circuit means for providing a plurality of signals having individual frequencies differing from one another within said band by integral multiples of a particular frequency to define frequency scale points;

second mixing means for combining the signals of the individual frequencies from the second circuit means and the difference frequency signals from the first mixing means to provide a signal having a frequency within a narrow band that is independent of the frequency scale points and that constitutes a difference in frequencies between the difference frequency signals from the first mixing means and the signal from the second circuit means of individual frequency closest to the difference frequency signals from the first mixing means;

third circuit means for providing a reference signal of adjustable frequency;

fourth circuit means for comparing the reference signal and the signal from the second mixing means to provide an error signal for controlling the frequency of the wide band oscillator;

means for adjusting the frequency of the output signal from the wide band oscillator in accordance with the characteristics of the error signal from the fourth circuit means;

first frequency selection circuit means operatively coupled to said first circuit means and adjustable in operation to control the frequency of the signal from the first circuit means within a range substantially equal to the range of frequencies between successive frequency scale points;

second frequency selection circuit means operatively coupled to the third circuit means and adjustable to shift the frequency of the reference signal in accordance with such adjustments; and means operatively coupled to the first frequency selection circuit means for providing a voltage in accordance with the adjustments in the operation of the first frequency selection circuit means to control the frequency of the output signal from the wide band oscillator.

8. A signal generator for providing a signal having a particular frequency selected from a larger band comprising:

an input section with adjustable input elements;

first circuit means providing a plurality of signals, the frequencies of the signals of the plurality being separated from one another by a particular magnitude;

a first controlled oscillator responsive to adjustments of first particular input elements in the input section to provide signals with first individual frequencies within the range of frequencies constituting the particular magnitude in accordance with the adjustments of the first particular elements;

a second controlled oscillator responsive to adjustments of second particular elements in the input section to provide signals with second individual frequencies within a range of frequencies less than the particular magnitude;

a third controlled oscillator for providing signals having frequencies within the larger band in accordance with adjustments of the first particular input elements;

combining means connected in a closed loop and responsive in the closed loop to the signals from the first circuit means and the first, second and third oscillators for combining these signals in a particular relationship to provide an error signal; and means responsive to the error signal for introducing the error signal to the third controlled oscillator to obtain an adjustment in the frequency of the signals from the third controlled oscillator to the particular frequency;

the combining means including first mixer means with a low pass output for combining the signals from the first oscillator and the third oscillator to provide particular difference frequencies as an output, and second mixer means with a low pass output for combining the output of the first mixer means with the signals from the first circuit means to produce output signals having a frequency representing the difference between the frequency of the output from the first mixer means and the closest frequency in the signals from the first circuit means, the combining means further including second circuit means for comparing the output signals from the second mixer means with the signals from the second oscillator to provide difference signals, and means for introducing the difference signals from the second circuit means to the third controlled oscillator to control the frequency of the signals from the third oscillator in accordance with the frequency of such difference signals.

9. A signal generator as in claim 8, wherein the first mixer means provides signals in a higher frequency range than the second mixer means.

10. A signal generator as in claim 9, wherein each of the first and second oscillators is included in an individual phase lock feedback loop to provide a phase lock dependent upon the adjustments of the associated ones of the input elements for controlling the individual frequencies from the first and second oscillators.

11. A signal generator as in claim 8, wherein the third controlled oscillator is connected in a phase lock feedback loop with the combining means to provide the signals at the particular frequency and wherein the second mixer means are included in such phase lock feedback loop to select an individual one of the signals from the first circuit means closest in frequency to the frequency of the signals from the first mixer means, in accordance with the adjustments in the first particular input elements of the input section, for combination with the signals from the second mixer means to obtain the output signals.

12. A signal generator for providing a signal having a particular frequency within a larger band comprising:

an input section having adjustable input elements;

first circuit means providing a plurality of signals separated from one another by a particular value;

second circuit means resonsive to the adjustments of at least first particular ones of the input elements in the input section to provide a signal having a frequency variable by particular increments within such particular value in accordance with the adjustments in the first particular input elements;

third circuit means for providing a difference signal having a frequency less than the frequency of the signal from the second circuit means but dependent upon the adjustments of at least second particular ones of the input elements;

oscillator means responsive to the adjustments of the first particular ones of the input elements for providing a signal having a variable frequency within the larger band in accordance with such adjustments;

frequency combining means responsive to the signals from the second circuit means and the oscillator means for providing a signal having a beat frequency dependent upon the differences in the frequencies of such responsive signals;

fourth circuit means responsive to the signals from the first circuit means and the frequency combining means for selecting an individual one of the beat frequency signals of the plurality from the first circuit means and for producing a signal having a frequency dependent upon differences in the frequencies of such selected signal and the frequencies of the signal from the frequency combining means;

fifth circuit means responsive to the signals from the fourth circuit means and the third circuit means for producing an error signal having characteristics dependent upon differences in the relative frequencies of the signals from the third and fourth circuit means; and feedback circuit means for providing for an adjustment of the frequency of the signals from the oscillator means in accordance with the characteristics of the error signal to generate the signal having the particular frequency.

13. A generator as in claim 12, wherein the fourth circuit means includes mixer means and low pass filter means for combining the signals from the first circuit means and the frequency combining means to produce beat frequency signals representing particular differences in the frequencies of the signals from the first circuit means and the frequency combining means.

14. A generator as in claim 13, wherein the oscillator means provides signals having a frequency within the larger band, the second circuit means provides the signals with a frequency which is composed of a median frequency within the larger band to which median frequency has been added a frequency no greater than the particular value in accordance with the adjustments of the first particular ones of the input elements of the input section and the frequency combining means includes first mixer means and first low pass filter means for combining the output of the oscillator means and the second circuit means and for passing the beat frequency signals having a frequency below a first particular value and the fourth circuit means further includes second mixer means and second low pass filter means for combining the output of the first low pass filter means with the output of the first circuit means and for passing the resultant signals having a frequency below a second particular value where the second particular value is less than the first particular value and is less than the separation in the frequencies of the signals from the first circuit means.

15. A generator as in claim 14, wherein the third circuit means provides the reference signal with a frequency dependent upon the adjustments of the second particular ones of the input elements of the input section and having a higher resolution on a numerical scale than that provided by the second circuit means.

16. A generator as in claim 12, wherein the third circuit means are included in a phase lock loop responsive to adjustments of second particular ones of the input elements of the input section to produce a reference signal having a frequency dependent upon such adjustments.

17. A signal generator for providing a signal having a particular frequency within a large band, comprising:
at least a pair of oscillating means each providing a signal having a frequency selectable from an individual plurality of discrete frequencies within an individual band having a width different from the widths of the other individual bands, each oscillating means including feedback means for controlling the production of the selectable frequency of the signal within each band;
input selection means having adjustable characteristics for selecting a frequency within the large band in accordance with such adjustments and being operatively coupled to the oscillating means of the pair for controlling the selection in each of the individual oscillating means of the discrete frequency within the individual band;
circuit means for providing a plurality of signals constituting a particular fundamental frequency and harmonics of the fundamental frequency and defining a comb within the large band;
additional oscillating means responsive to the input selection means for providing signals having a particular frequency within the large band in accordance with the adjustments of the input selection means;
the additional oscillating means including feedback means for controlling the production of the selectable frequency within the large band; and
signal combining means for mixing the signals from at least the pair of the oscillating means and the additional oscillating means and the signals from the circuit means in particular relationships defining the feedback means for the additional oscillating means to obtain a signal having the particular frequency from the additional oscillating means,
the signal combining means including low pass filter means for providing for the selection of an individual one of the frequencies in the comb in accordance with the adjustments in the input selection means.

18. A signal generator for providing a signal having a particular frequency within a large band, comprising:
at least a pair of oscillating means each providing a signal having a frequency selectable from an individual plurality of discrete frequencies within an individual band having a width different from the widths of the outer individual bands, each oscillating means including feedback means for controlling the production of the selectable frequency of the signal within each band;
input selection means having adjustable characteristics for selecting a frequency within the large band in accordance with such adjustments and being operatively coupled to the oscillating means of the pair for controlling the selection in each of the individual oscillating means of the discrete frequency within the individual band;
circuit means for providing a plurality of signals constituting a particular fundamental frequency and harmonics of the fundamental frequency and defining a comb within the large band;
additional oscillating means responsive to the input selection means for providing signals having a particular frequency within the large band in accordance with the adjustments of the input selection means;
the additional oscillating means including feedback means for controlling the production of the selectable frequency within the large band; and
signal combining means for mixing the signals from at least the pair of the oscillating means and the additional oscillating means and the signals from the circuit means in particular relationships defining the feedback means for the additional oscillating means to obtain a signal having the particular frequency from the additional oscillating means,
the signal combining means being included in the feedback means for the additional oscillating means and including a first mixer for combining the signals from the additional oscillating means and a particular one of the oscillating means in the pair and further including a first low pass filter for passing from the first mixer only signals below a first cutoff frequency and including a second mixer for combining the signals from the first low pass filter and the signals from the circuit means and a second low pass filter for passing from the second mixer only signals below a second cutoff frequency lower than the first cutoff frequency and lower than the difference in frequency between successive harmonics in the comb and further including means for comparing the signals passing through the second low pass filter with the signals from the other particular one of the oscillating means in the pair to produce error signals for adjusting the frequency of the signal from the additional oscillating means to the particular value.

19. A signal generator as in claim 18, wherein the additional oscillating means includes a wide band oscillator and the second low pass filter passes only the signals having a beat frequency constituting the difference between the frequency of the signals from the first low pass filter and the signal from the circuit means with the frequency closest to the frequency of the signals from the first low pass filter and wherein the other particular oscillator means in the pair has a smaller bandwidth than the first particular oscillator means in the pair.

20. A signal generator as in claim 19, wherein the other particular one of the oscillating means in the pair provides a reference signal having a frequency adjustable in accordance with adjustments in the input selection means and comparator means included in the signal combining means are responsive to the reference signal and the signals from the second low pass filter to provide an error signal having characteristics dependent upon any differences between the frequencies of these signals and wherein means are included in the signal combining means for introducing the error signal to the additional oscillator means to adjust the frequency of the signals from the additional oscillator means to the particular value.

21. A signal generator as in claim 20, wherein each of the feedback means for each of the oscillating means in the pair includes an individual voltage controlled oscillator responsive to the adjustments of the input selection means for providing signals in an individual band related to the particular fundamental frequency and variable within the individual band in accordance with adjustments in the input selection means; and each of the feedback means for each of the oscillating means in the pair includes phase lock means each associated with an individual one of the voltage controlled oscillators for controlling the frequency of the signals from the associated voltage controlled oscillator in accordance with the adjustments of the input selection means.

22. A signal generator as in claim 21 wherein each of the feedback means for the oscillating means in the pair includes a digital-to-analog converter responsive to the adjustments of the input selection means for introducing to the associated voltage controlled oscillator a voltage dependent upon the adjustments of the input selection means to control the frequency of the signals from the voltage controlled oscillator in accordance with such adjustments.

23. A signal generator as in claim 18 wherein each of the oscillating means in the pair includes means for producing signals having individual ones of a plurality of equidistantly spaced frequencies within the individual band for that oscillating means, the input selection means being adjustable to select the individual ones of the individual frequencies within the individual band for each of the oscillating means in the plurality.

24. A signal generator for providing a signal having a particular frequency within a first frequency band, comprising:

an input section with adjustable input elements;
first circuit means providing a plurality of signals, the frequencies of the signals of the plurality being equidistantly spaced to define a comb of a particular fundamental frequency and harmonics of the particular fundamental frequency within the first frequency band;

first voltage controlled oscillator means connected in a feedback configuration in a phase lock loop and responsive to adjustments of first particular ones of the input elements in the input section to provide, in accordance with such adjustments, individual ones of a plurality of frequencies within a second frequency band less than the first frequency band;

second voltage controlled oscillator means connected in a feedback configuration and responsive to adjustments of second particular ones of the input elements in the input section to provide, in accordance with such adjustments, individual ones of a plurality of signals within a third frequency band less than the first frequency band and the second frequency band;

third oscillator means responsive to the adjustments of the first particular ones of the input elements for providing signals having a particular frequency within substantially the particular first frequency band in accordance with such adjustments; and second circuit means (a) responsive to the signals from the third oscillator means and the first voltage controlled oscillator means for producing first beat frequency signals having a first limited range of frequencies less than the frequencies provided within the first frequency band and constituting the differences between the frequencies of the signals from the third oscillator means and the first voltage controlled oscillator means and (b) responsive to the first beat frequency signals and the signals from the first circuit means for producing second beat frequency signals having a second limited range of frequencies less than the first limited range of frequencies but greater than the third frequency band and constituting the difference between the frequencies of the first beat frequency signals and the signals from the first circuit means and (c) responsive to the second beat frequency signals and the signals from the second voltage controlled oscillator means for producing error signals having characteristics representing the difference in frequencies between the second beat frequency signals and the signals from the second voltage controlled oscillator means and (d) responsive to the error signals for adjusting the frequency of the signals from the third oscillator means to the particular value in accordance with the characteristics of the error signals.

25. A signal generator as in claim 24, wherein the second circuit means includes first mixer means for mixing the signals from the third oscillator means and the first voltage controlled oscillator means and further includes first low pass filter means for passing from the first mixer means signals only within the first limited range of frequencies.

26. A signal generator as in claim 24, wherein the phase lock loop of the first voltage controlled oscillator means includes the first particular ones of the input elements individually adjustable within the input section, means responsive to the adjustments of the first particular ones of the input elements for providing a voltage dependent upon such adjustments, a voltage controlled oscillator for producing signals having a frequency dependent upon the voltage from the last mentioned means, signal means for providing signals having a reference frequency and phase lock means responsive to the signals from the signal means and the voltage controlled oscillator to produce signals having a frequency representative of the adjustments of the first particular ones of the input elements.

27. A signal generator as in claim 25, wherein means are provided for producing a voltage in accordance with the adjustments of the first particular ones of the input elements and wherein the frequency of the signals from the third oscillator means is adjusted within the first frequency band in accordance with such voltage.

28. A signal generator as in claim 25 wherein the second circuit means includes second mixer means for mixing the signals from the first low pass filter means and from the first circuit means and second low pass filter means for passing from the second mixer means only signals within the second limited range of frequencies.

29. A signal generator as in claim 28 wherein the second voltage controlled oscillator means includes the second particular ones of the input elements individually adjustable within the input section, means responsive to the adjustments of the second particular ones of the input elements for providing a voltage dependent upon such adjustments, a voltage controlled oscillator for producing signals having a frequency dependent upon the voltage from the last mentioned means, signal means for providing signals having a reference frequency and phase lock means responsive to the signals from the signal means and the voltage controlled oscillator to produce signals having a frequency representative of the adjustments of the second particular ones of the input elements and the second circuit means includes second phase lock means responsive to the signals from the second low pass filter and the signals from the phase lock means in the second voltage controlled oscillator means for producing the error signals.

* * * * *